(12) United States Patent
Meyer et al.

(10) Patent No.: US 8,878,335 B2
(45) Date of Patent: Nov. 4, 2014

(54) METHOD AND SYSTEM FOR PROVIDING FUSING AFTER PACKAGING OF SEMICONDUCTOR DEVICES

(75) Inventors: Thorsten Meyer, Regensburg (DE); Josef Boeck, Munich (DE); Rudolf Lachner, Ingolstadt (DE); Herbert Schaefer, Hoehenkirchen-Siegertsbrunn (DE)

(73) Assignee: Infineon Technologies AG, Neubiberg (DE)

( * ) Notice: Subject to any disclaimer, the term of this patent is extended or adjusted under 35 U.S.C. 154(b) by 297 days.

(21) Appl. No.: 12/977,104

(22) Filed: Dec. 23, 2010

(65) Prior Publication Data

US 2012/0161278 A1 Jun. 28, 2012

(51) Int. Cl.
*H01L 29/00* (2006.01)
*H01L 23/525* (2006.01)
*H01L 21/66* (2006.01)

(52) U.S. Cl.
CPC ... *H01L 23/5258* (2013.01); *H01L 2924/12044* (2013.01); *H01L 22/14* (2013.01); *H01L 2924/014* (2013.01); *H01L 22/22* (2013.01)
USPC .......................................................... 257/529

(58) Field of Classification Search
USPC .......................................... 257/529, E29.166
See application file for complete search history.

(56) References Cited

U.S. PATENT DOCUMENTS 7,701,035 B2 4/2010 Greco et al.
2004/0262768 A1* 12/2004 Cho et al. ..................... 257/758

* cited by examiner

*Primary Examiner* — Tran Tran

(57) ABSTRACT

A method and a system for providing fusing after packaging of semiconductor devices are disclosed. In one embodiment, a semiconductor device is provided comprising a substrate comprising a fuse area, at least one fuse disposed in the fuse area, and at least one layer disposed over the substrate, wherein the at least one layer comprises at least one opening exposing the at least one fuse.

5 Claims, 22 Drawing Sheets

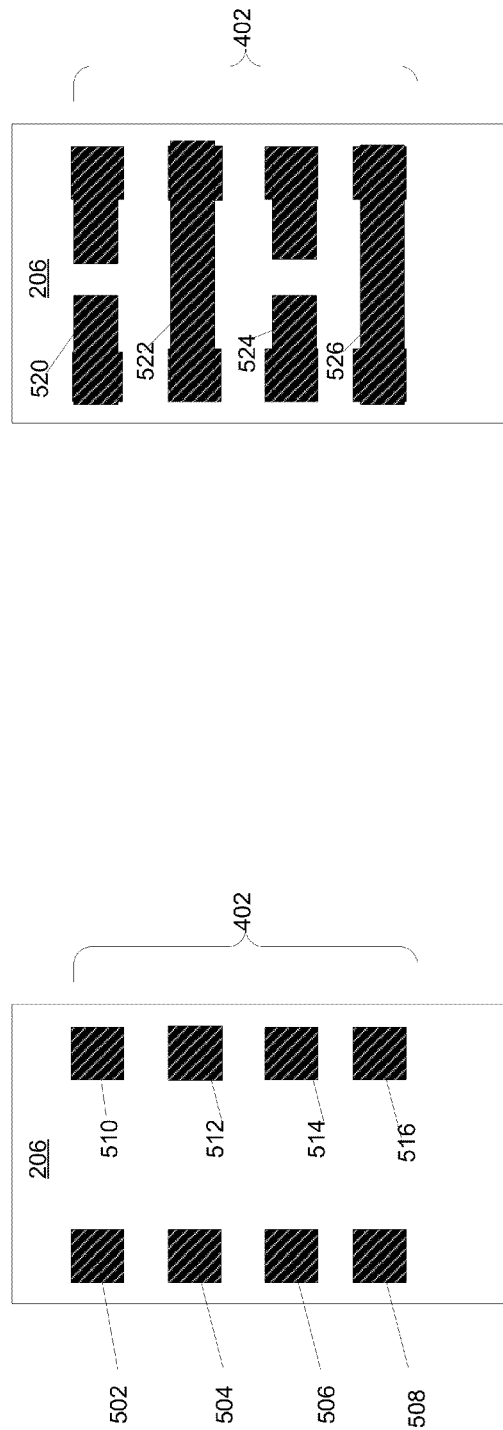
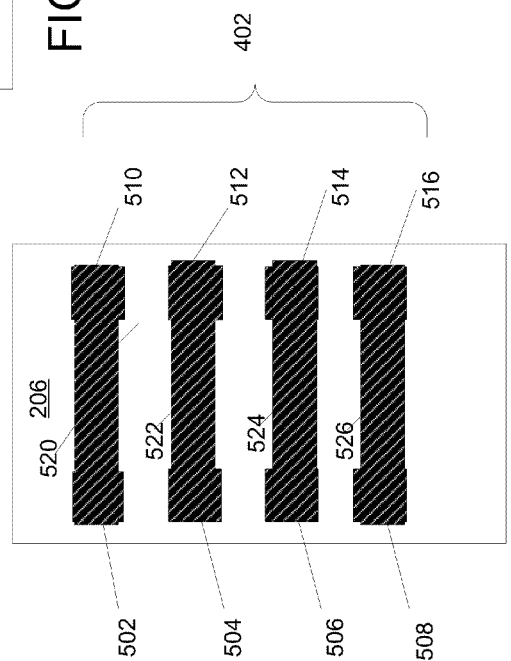
FIGURE 5A
FIGURE 5B
FIGURE 5C

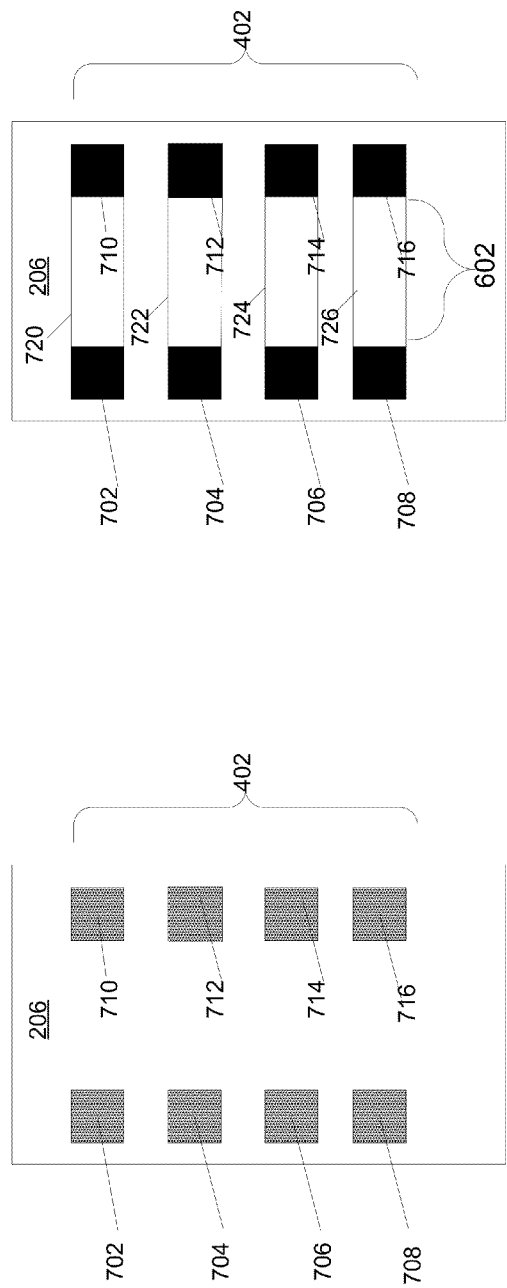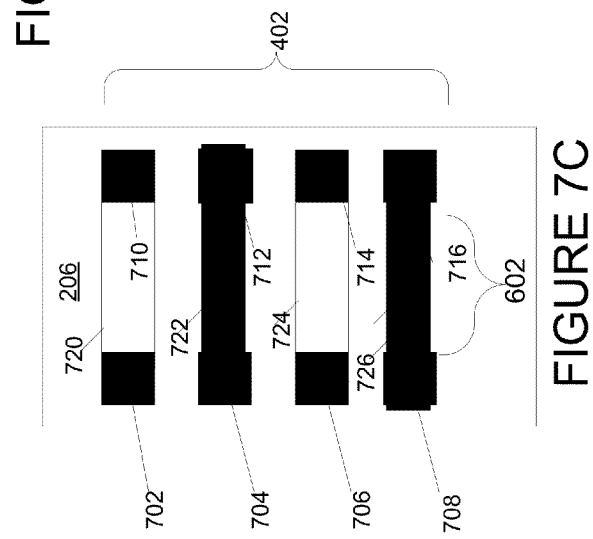

METHOD AND SYSTEM FOR PROVIDING FUSING AFTER PACKAGING OF SEMICONDUCTOR DEVICES

TECHNICAL FIELD

The present invention relates generally to providing fusing in semiconductor devices. In particular, the present disclosure relates to a method and system for providing fusing after packaging of semiconductor devices.

BACKGROUND

In some semiconductor devices, fuses are placed to provide specific functions, for example, adjusting frequency of a radar sensor. These fuses are typically aluminum structures that are susceptible to being blown during wafer level testing by a laser. This is because fuses are placed in the semiconductor device before the device is packaged. This affects the performance of the overall semiconductor device. Therefore, a need exists for a method and system for providing fusing after the semiconductor device is packaged.

BRIEF DESCRIPTION OF DRAWINGS

FIGS. 5A to 5C are diagrams illustrating fuses formed in the redistribution layer in accordance with one embodiment of the present disclosure.

FIGS. 7A to 7C are diagrams illustrating fuses formed in the redistribution layer in accordance with an alternative embodiment of the present disclosure.

SUMMARY OF INVENTION

Figure 1:
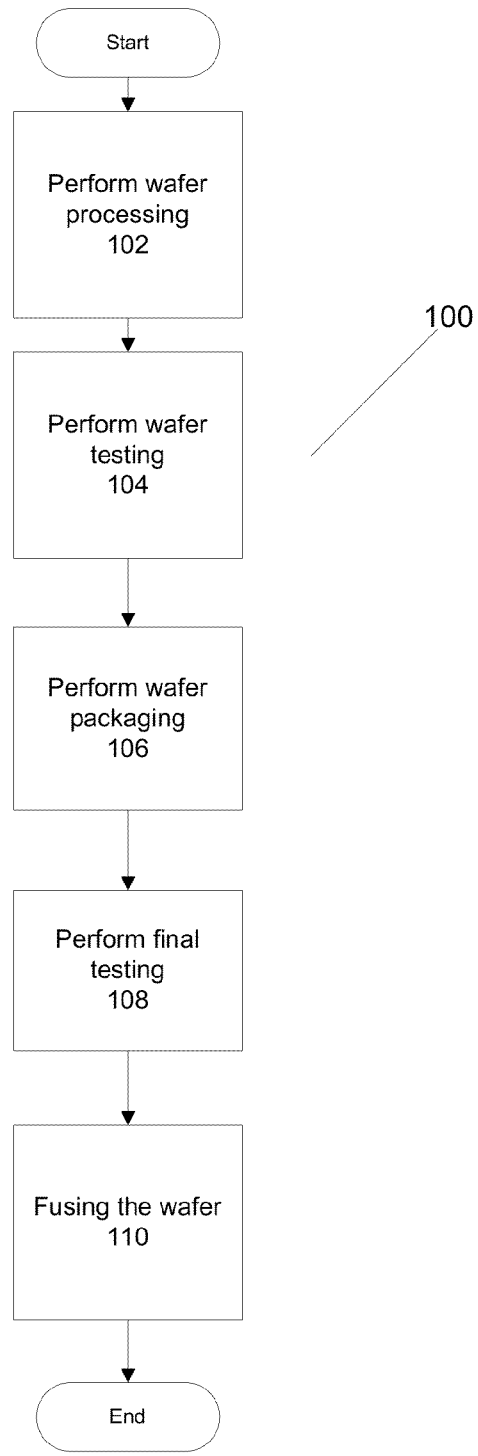
FIG. 1 illustrates a flowchart of an exemplary process for providing fusing after packaging of semiconductor devices in accordance with one embodiment of the present disclosure.

A method and a system for providing fusing after packaging of semiconductor devices are disclosed. In one embodiment, a semiconductor device is provided comprising a substrate comprising a fuse area, at least one fuse disposed in the fuse area, and at least one layer disposed over the substrate, wherein the at least one layer comprises at least one opening exposing the at least one fuse.

In an alternative embodiment, the semiconductor device comprises a plurality of contact pads disposed within a substrate, at least one layer disposed over the substrate and around the plurality of contact pads; and a redistribution layer disposed between some of the plurality of pads to form at least one fuse In yet another alternative embodiment, the semiconductor device comprises a plurality of contact pads disposed within a substrate, at least one layer disposed over the substrate and around the plurality of contact pads, a redistribution layer disposed over the plurality of contact pads to form at least one fuse.

In still yet another alternative embodiment, a method for providing fusing comprising performing processing of a wafer, packaging the wafer, performing electrical performance testing of the wafer, and performing fusing on the wafer after the electrical performance testing of the wafer.

In a further embodiment, a fuse device is provided comprising a fuse area provided in a wafer, the fuse area comprising at least one opening, at least one fuse disposed in the at least one opening, and at least one layer disposed around the at least one opening.

DETAIL DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, frequency adjustment sensors, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact elements which allow electrical contact to be made with the semiconductor chips. The contact elements may be composed of any desired electrically conductive material, for example, of a metal, such as aluminum, nickel, palladium, gold or copper, a metal alloy, a metal stack or an electrically conductive organic material. The contact elements may be situated on the active main surfaces of the semiconductor chips or on other surfaces of the semiconductor chips. The active or passive structures of the semiconductor chips are usually arranged below the active main surfaces and can be electrically contacted via the contact elements. In case of power transistors, the contact elements may be drain, source or date electrodes The devices described in the following may include external contact elements that are accessible from outside of the devices to allow electrical contact to be made from outside of the devices. In addition, the external contact elements may be thermally conductive and serve as heat sinks for heat dissipation of the semiconductor chips. The external contact elements may be composed of any electrically conductive material, for example, a metal such as copper, Pd, Ni, Au, etc.

The devices described in the following may include an encapsulating material covering at least parts of the semiconductor chips. The encapsulating material is an electrically insulating material, which is at most marginally electrically conductive relative to the electrically conductive components of the device. Examples of an encapsulating material include a mold material like an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

The present disclosure provides a method and a system for providing fusing after packaging of the semiconductor device. A semiconductor device typically comprises a substrate, a dielectric layer disposed over the substrate, a redistribution layer disposed over the dielectric layer and structured to provide landing pads for external connections, a solder stop layer disposed over the redistribution layer, and conductive elements such as solder balls. In a typical semiconductor device packaging process, these layers and conductive elements may cover the fuse area.

In order to provide fusing after packaging, the fuse area is exposed to provide the laser access to the fuses. Openings in the different dielectric and solder stop layers are provided in the fuse area and the redistribution layer routes around this fuse area. To protect the fuses from being damaged during processing, a protective layer, such as a thin oxide, a nitride, or a dielectric layer, may be provided to cover the fuses during wafer processing. The protective layer has a thickness sufficient for protecting the fuses from being damaged during processing and laser adjustment.

Alternative to fusing by laser, fuses may be provided as contact pads and may be generated during thin-film processing in the redistribution layer. In this case, the opening of the fuse area may be performed, for example, by cutting or etching the redistribution layer, before the solder stop layer is applied if performance changes slightly due to final processing or after processing is complete. In addition, the fuses may be provided as contact pads and are closed according to the result of performance testing of the final package. The fuses may be closed by applying conductive adhesive, wire bonding, bridge soldering, etc.

By providing fusing after packaging of the semiconductor device, influence from the packaging process may be included in performance optimization, which results in improved electrical performance and higher yield. In addition, single chip tracking may be accomplished by fusing after packaging. Single chip tracking provides the ability to identify a specific position of a semiconductor chip on a wafer. In this case, not only can single chip tracking be performed on a regular wafer, it may also be performed on a reconstituted wafer. Typically, single chip tracking is performed by optical read out in the redistribution layer, which requires de-mounting of the chip at the customer and which is not a solution for every application due to electrical performance reason. However, fusing allows the semiconductor chip to be coded after packaging without de-mounting the chip or worsening the performance of the application.

Referring to FIG. 1, a flowchart of an exemplary process for providing fusing after packaging of semiconductor devices is depicted in accordance with one embodiment of the present disclosure. Process 100 begins at step 102 to perform wafer processing. Next, process 100 continues to step 104 to perform wafer level testing. Next process 100 continues to step 106 to perform wafer packaging. Wafer packaging may include application of dielectric layer, a redistribution layer, and solder stop layer. After packaging is completed, process 100 continues to step 108 to perform final electrical performance testing. The test may be performed at the wafer level. Process 100 then completes at step 110 to fuse after the wafer level final performance testing.

Figure 2A:
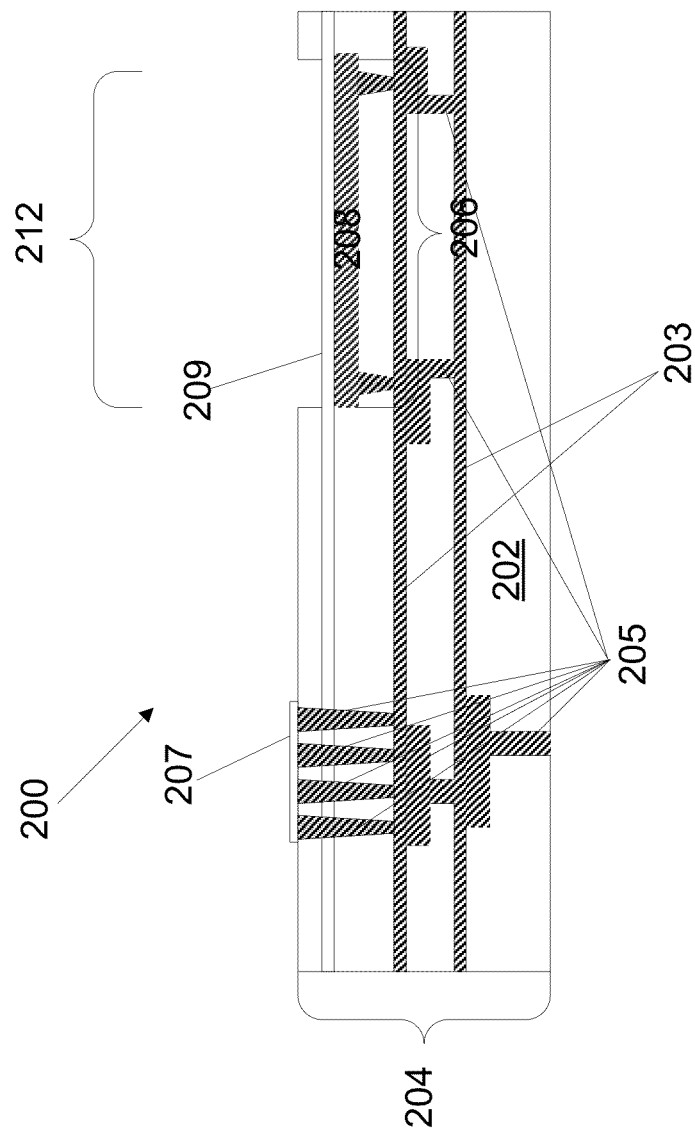
FIGS. 2A to 2F are diagrams illustrating a process for providing fusing after packaging of semiconductor devices in accordance with one embodiment of the present disclosure.

Referring to FIGS. 2A to 2F, diagrams illustrating a process for providing fusing after packaging of semiconductor devices are depicted in accordance with one embodiment of the present disclosure. As shown in FIG. 2A, wafer 200 comprises a plurality of layers 204. The plurality of layers 204 may include one or more substrates 202, one or more metallization layers 203, and one or more through connections 205 between the plurality of layers 204. In addition, wafer 200 comprises a contact pad 207 for external connections. The one or more metallization layers 203, the one or more through connections 205, and the contact pad 207 may be composed of conductive material. For example, the one or more through connections 205 may be composed of tungsten, and the contact pad 207 may be made of aluminum or alloys containing aluminum or gold.

A fuse area 206 with one or more fuses 208 is also provided within wafer 200. One example of a fuse 208 may be a standard aluminum fuse. A protective layer 209, such as a thin oxide, nitride or dielectric layer, may be provided over the one or more fuses 208 to protect the fuses from chemicals during subsequent processing. However, the thickness of protective layer 209 should be thick enough for protection and thin enough to allow access by laser. For example, a protective oxide layer may be provided with a thickness of about 350 to 500 nm. However, one or more fuses 208 may be provided without the overlying protective layer 209 without departing the spirit and scope of the present disclosure. In this embodiment, an opening 212 is provided to allow access to the one or more fuses 208.

Figure 2B:
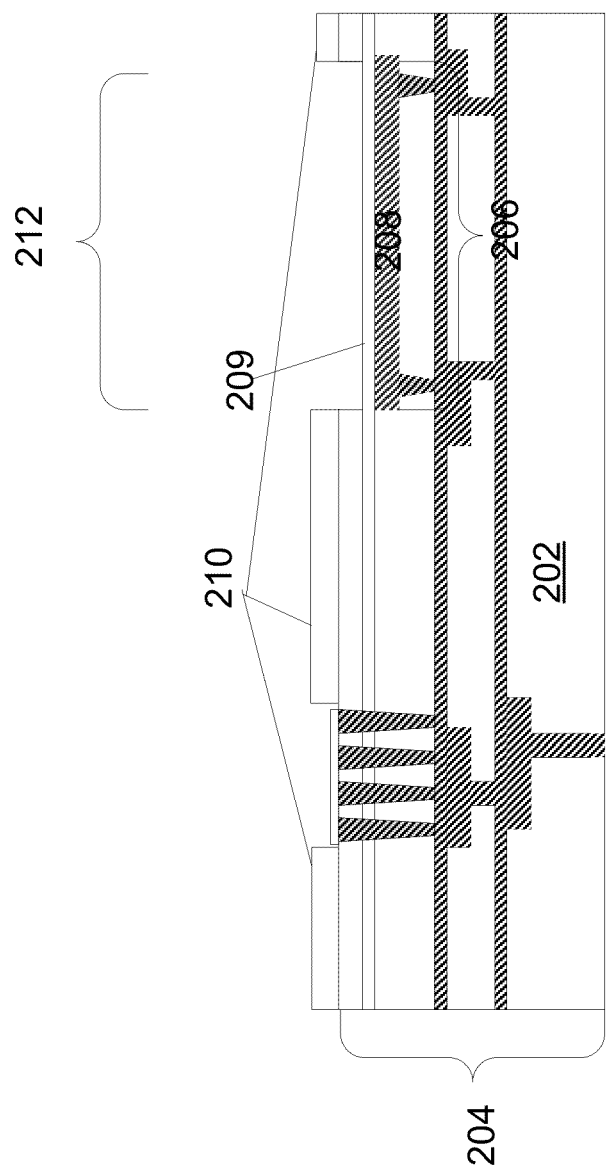

Referring to FIG. 2B, a dielectric layer 210 is then disposed and structured over the wafer 200. Typically, dielectric layer 210 is disposed over the fuse area 206 to protect the fuses 208 from being damaged during processing. However, in this case, an opening 212 is formed in the dielectric layer 210 to expose fuse area 206 in order to provide later access by the laser.

Figure 2C:
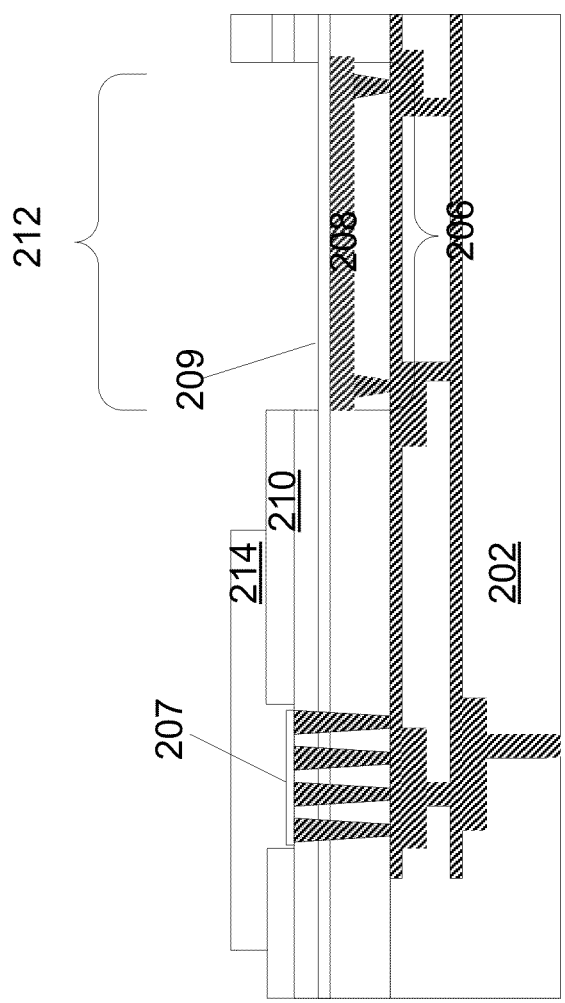

Referring to FIG. 2C, a redistribution layer 214 is then disposed over dielectric layer 210 and structured to provide external connection to the plurality of contacts 207. The redistribution layer 214 may be composed of metallic material. The redistribution lines in the redistribution layer 214 route around the fuse area 206 such that fuses 208 may remain exposed for later access by the laser.

Figure 2D:
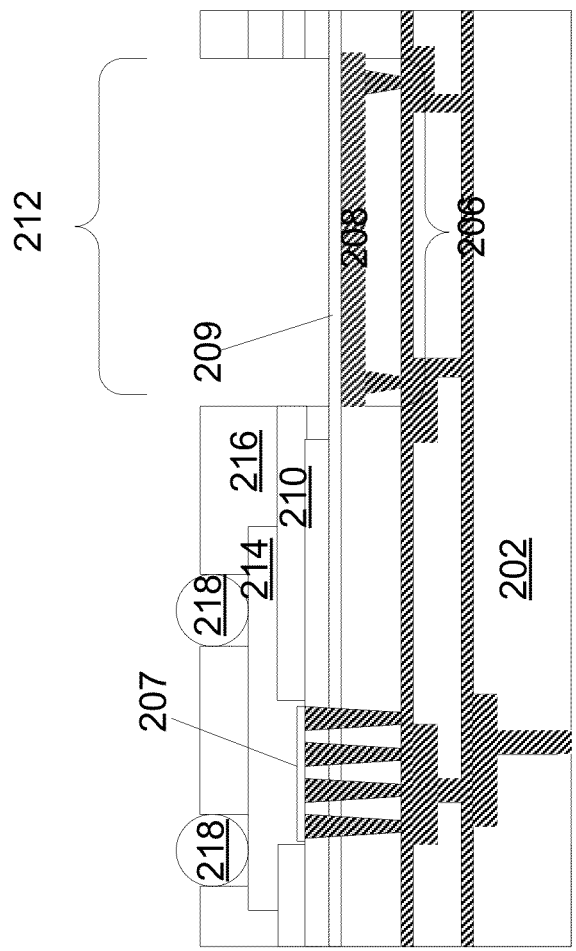
Figure 2E:
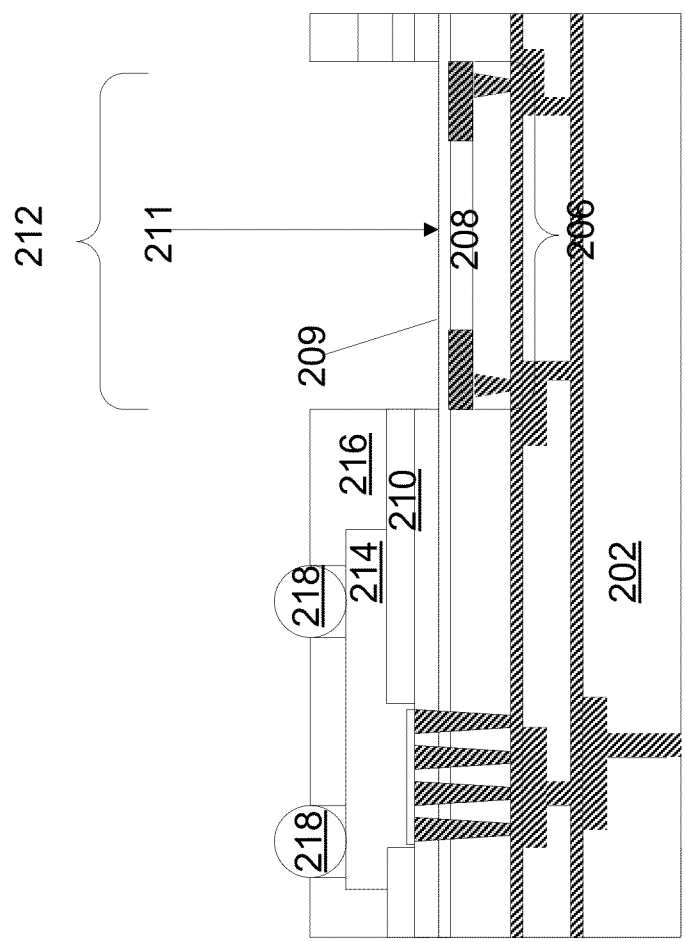

Referring to FIG. 2D, a solder stop layer 216 is then disposed over the redistribution layer 214 and structured to provide landing pads for external contact elements. The solder stop layer 216 is not disposed over the fuse area 206 in order to provide an opening 212 for later access of one or more fuses 208 by the laser. Conductive elements 218 such as solder balls may be disposed in the landing pads provided by solder stop layer 216 to provide external electrical connections. After the conductive elements 218 are applied, the packaging process is complete. Electrical performance testing may then be performed. Typically, electrical performance testing is performed through contacting the conductive elements 218. Referring to FIG. 2E, after electrical performance testing, fusing is performed to open one or more fuses 208 within fuse area 206. During attachment of the conductive elements 218, a reflow process is performed under high temperature. By fusing after such reflow process, performance improvement may be made with the consideration of the reflow process.

A laser 211 may be projected towards fuse 208 to cut or disconnection a portion of a fuse through the protective layer 209. Because one or more openings 212 are provided in fuse area 206, the one or more fuses 208 may be accessed by laser for fusing.

Figure 2F:
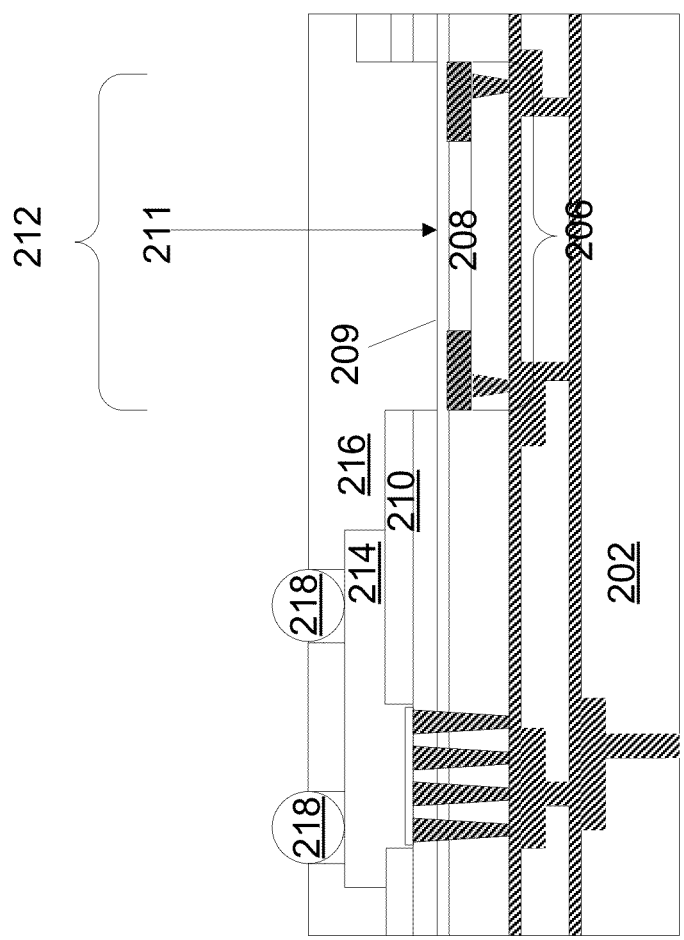

Referring to FIG. 2F, after fusing is complete, the fuse opening 212 may be optionally covered by a solder stop material 216 or other material to protect the fuse area 206 from external influence. Referring to FIG. 3A, a diagram illustrating an exemplary fuse area with one or more fuses before fusing is depicted in accordance with one embodiment of the present disclosure. FIG. 3A shows a top view of the fuse area 206 from FIGS. 2A to 2G. Fuse area 206 comprises one or more fuses 208. In this example, fuse area 206 comprises four fuses 302, 304, 306, and 308. These fuses in fuse area 206 are exposed to be later accessed by laser. After electrical performance testing is performed, fusing may be performed by laser to blow one or more fuses 208 in fuse area 206.

Figure 3B:
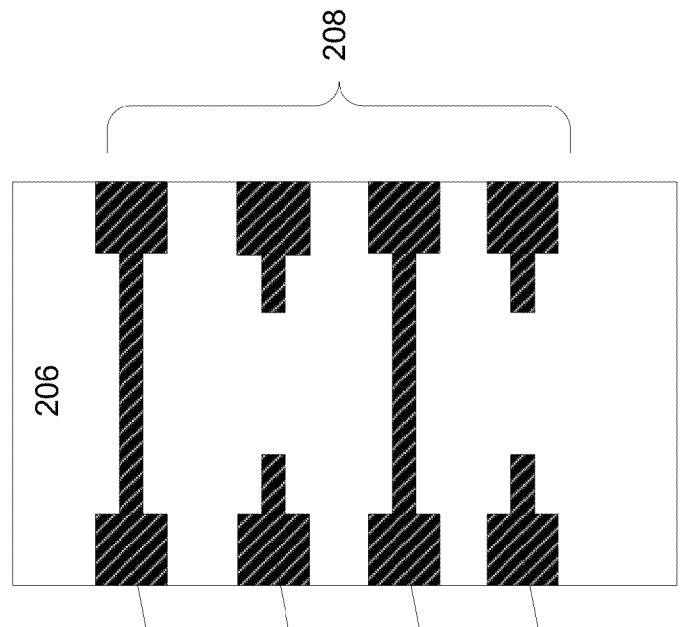
FIG. 3B is a diagram illustrating an exemplary fuse area with one or more fuses after fusing in accordance with one embodiment of the present disclosure.
Figure 3A:
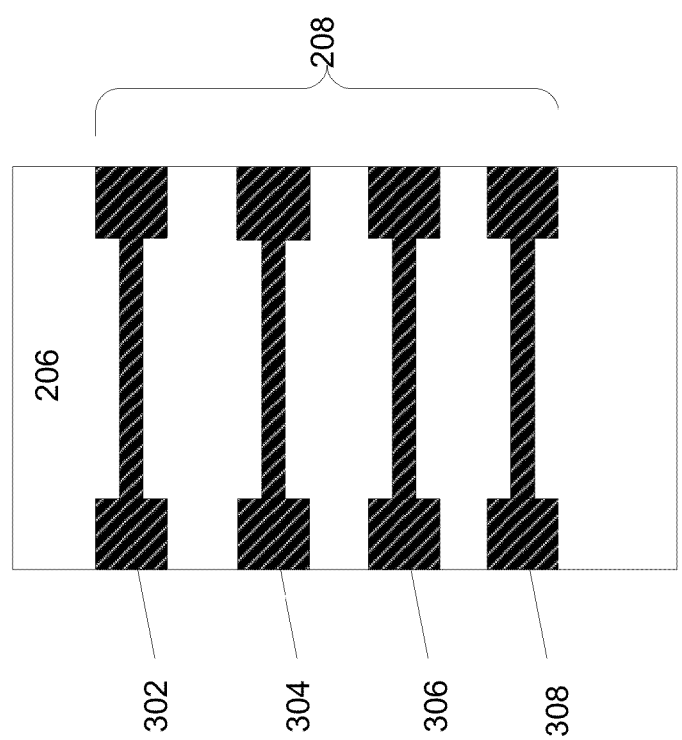
FIG. 3A is a diagram illustrating an exemplary fuse area with one or more fuses before fusing in accordance with one embodiment of the present disclosure.

Referring to FIG. 3B, a diagram illustrating an exemplary fuse area with one or more fuses after fusing is depicted in accordance with one embodiment of the present disclosure. In this example, fuse 304 and 308 are interrupted or opened since fuse area 206 is accessible by the laser after electrical performance testing.

Figure 4A:
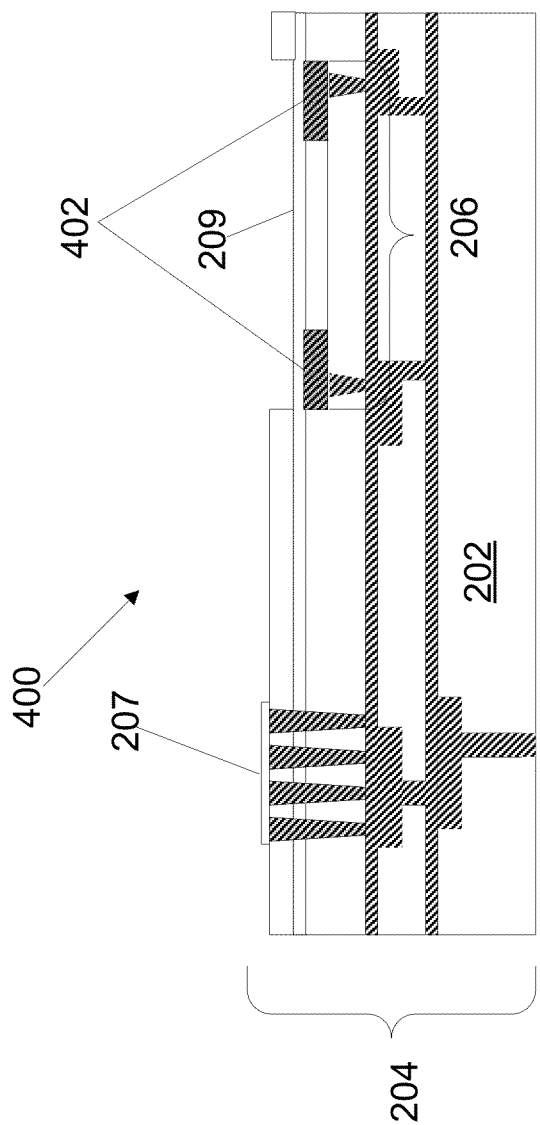
FIGS. 4A to 4F are diagrams illustrating a process for providing fusing after packaging of semiconductor devices in accordance with an alternative embodiment of the present disclosure.

As discussed above, alternative to providing standard fuses, fuses may be designed as contact pads and generated during thin film processing in the redistribution layer. Referring to FIGS. 4A to 4F, diagrams illustrating a process for providing fusing after packaging of semiconductor devices are depicted in accordance with an alternative embodiment of the present disclosure. FIG. 4A is similar to FIG. 2A in that wafer 400 also comprises substrate 202, a plurality of layers 204, a fuse area 206, a protective layer 209, and a contact pad 207.

Instead of one or more fuses 208, fuse area 206 comprises a plurality of contact pads 402 that are disposed over substrate or carrier 202. The plurality of contact pads 402 may be composed of aluminum or other types of metallic material.

Figure 4B:
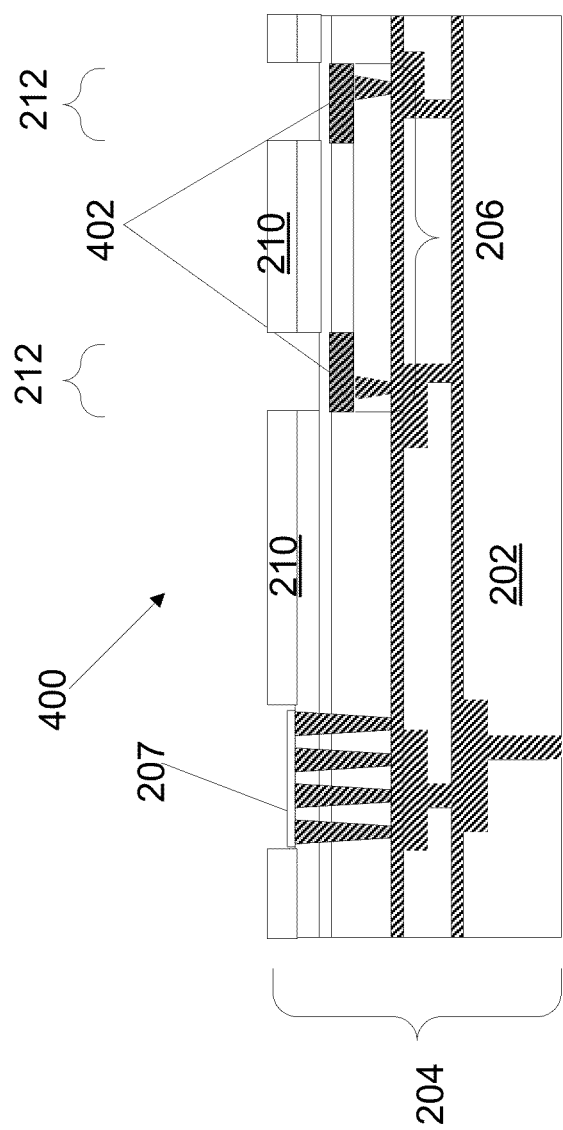

Referring to FIG. 4B, a dielectric layer 210 is then disposed and structured over the wafer 400. In this case, openings 212 are formed in the dielectric layer 210 to expose fuse area 206 and the plurality of contact pads 402 for photolithography processing.

Figure 4C:
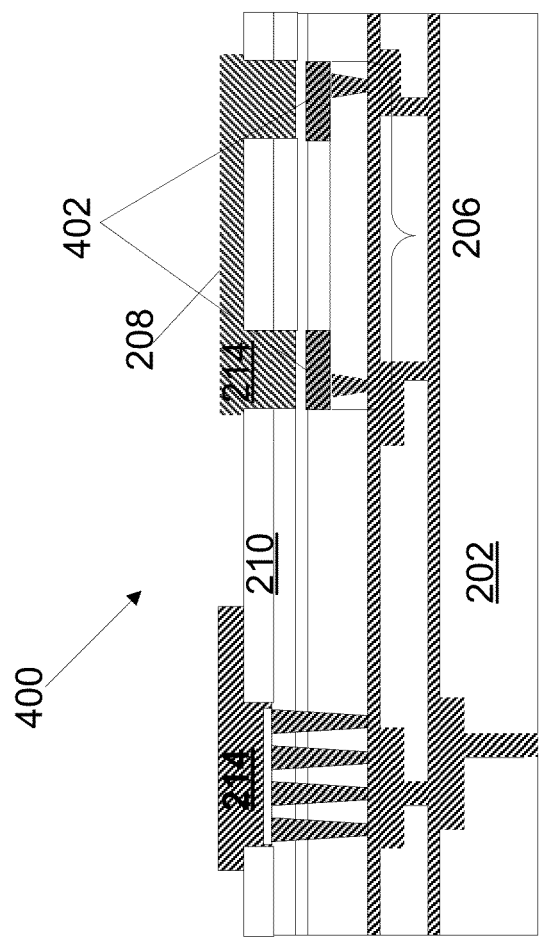

Referring to FIG. 4C, a redistribution layer 214 is then disposed over dielectric layer 210 and structured to provide external connections. The redistribution layer 214 may be composed of metallic material. While other redistribution lines in the redistribution layer 214 may route around the fuse area 206, one or more fuses 208 may also be formed in fuse area 206 with redistribution layer 214. In this embodiment, contact pads 402 are electrically coupled in the redistribution layer 214 by disposing metallic material across at least two contact pads 402. Once contact pads 402 are electrically coupled, one or more fuses 208 are formed and closed.

Figure 4D:
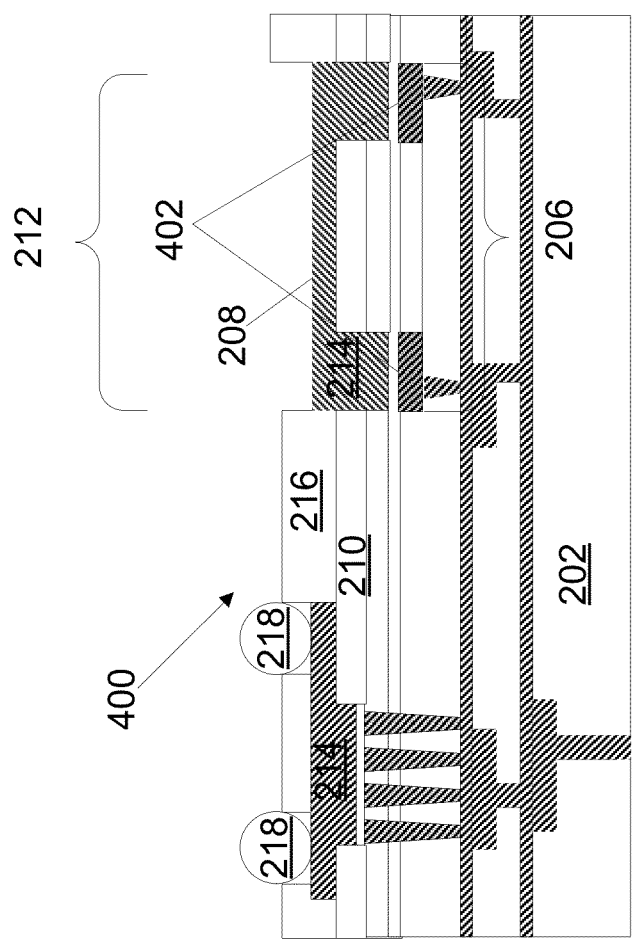

Referring to FIG. 4D, a solder stop layer 216 is then disposed over the redistribution layer 214 and structured to provide landing pads for external contact elements. The solder stop layer 216 is not disposed over the fuse area 206 with one or more closed fuses 208 in order to provide openings 212 for later access by the laser. In an alternative embodiment, the solder stop layer 216 may be disposed over gaps between the one or more closed fuses 208 in the fuse area 208 as later illustrated in FIGS. 5A to 5C. Conductive elements 218 such as solder balls may be disposed in the landing pads provided by solder stop layer 216 to provide external electrical connections.

Figure 4E:
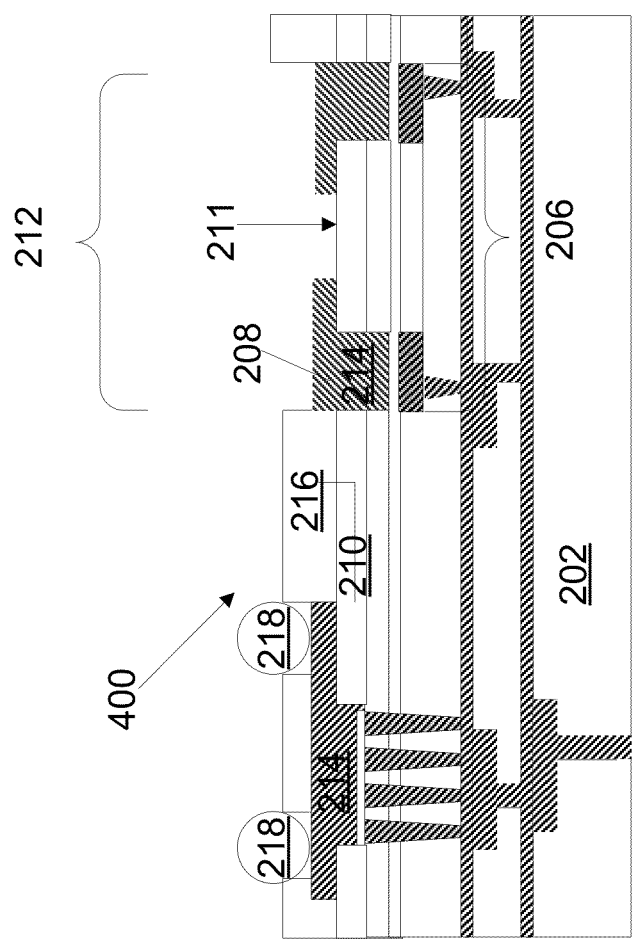

After the conductive elements 218 are applied, the packaging process is complete. Electrical performance testing may then be performed. Typically, electrical performance testing is performed through contacting the conductive elements 218. Referring to FIG. 4E, after electrical performance testing, fusing may be performed to open one or more fuses 208 within fuse area 206. A laser 211 may be projected towards one or more closed fuses 208 to cut or disconnection a portion of one or more fuses 208 through the redistribution layer 216. During attachment of the conductive elements 218, a reflow process is performed under high temperature. By fusing after such reflow process, performance improvement may be made with the consideration of the reflow process.

Because one or more openings 212 are provided, the one or more fuses 208 may be opened by cutting or disconnecting a portion of the redistribution layer disposed between the at least two contact pads 402 that were previously electrically coupled.

Figure 4F:
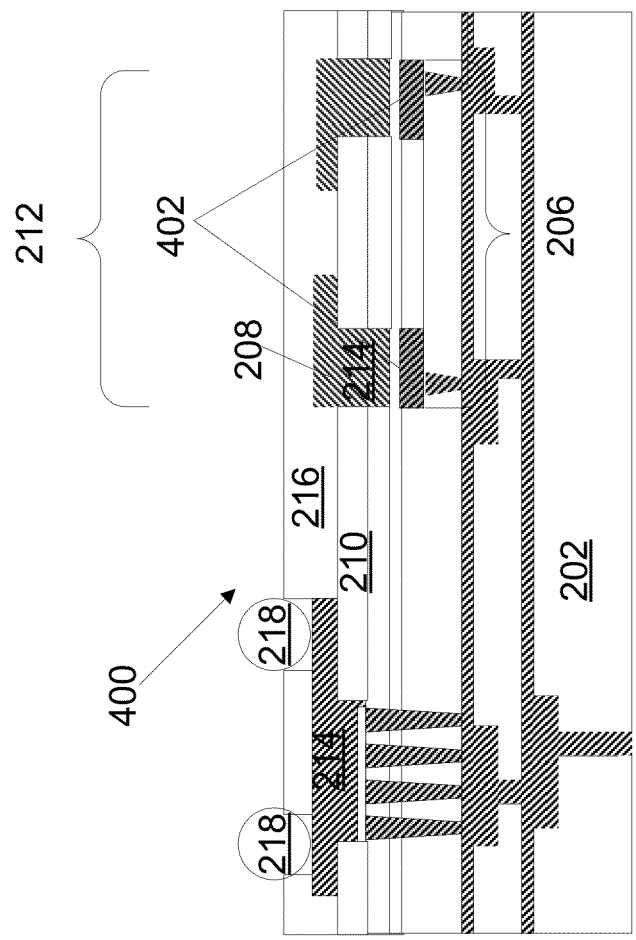

Referring to FIG. 4F, after fusing is complete, the fuse opening 212 may be optionally covered by a solder stop material 216 or other material to protect the fuse area 206 from external influence.

Referring to FIGS. 5A to 5C, diagrams illustrating fuses formed in the redistribution layer are depicted in accordance with one embodiment of the present disclosure. Referring to FIG. 5A, a plurality of contact pads 402 are provided in the fuse area 206. In one embodiment, the plurality of contact pads 402 may be composed of aluminum or other metallic material. As described previously in FIG. 4A, the plurality of contact pads 402 are disposed within fuse area 206 of wafer 400. In this example, eight contact pads are provided, contact pads 502 to 516.

Referring to FIG. 5B, the plurality of contact pads 402 in the fuse area 206 are electrically coupled within the redistribution layer 214. As described previously in FIG. 4C, the plurality of contact pads 402 are electrically coupled in the redistribution layer 214 by disposing metallic material across at least two contact pads. For example, contact pad 502 is electrically coupled to contact pad 510, contact pad 504 is electrically coupled to contact pad 512, contact pad 506 is electrically coupled to 514 and contact pad 508 is electrically coupled to contact pad 516. Once contact pads 402 are electrically coupled, one or more fuses 208 are formed and closed. In this example, four fuses 520 to 526 are formed.

Referring to FIG. 5C, the one or more fuses 208 are opened within fuse area 206 after electrical performance test is performed. In this example, fuse 520 and 524 are opened after electrical performance testing. In one embodiment, fuse 520 and 524 may be interrupted or opened by cutting by a laser or chemical etching a portion of the redistribution layer 214 that is disposed between the previously electrically coupled contact pads as described in FIG. 4E.

Figure 6A:
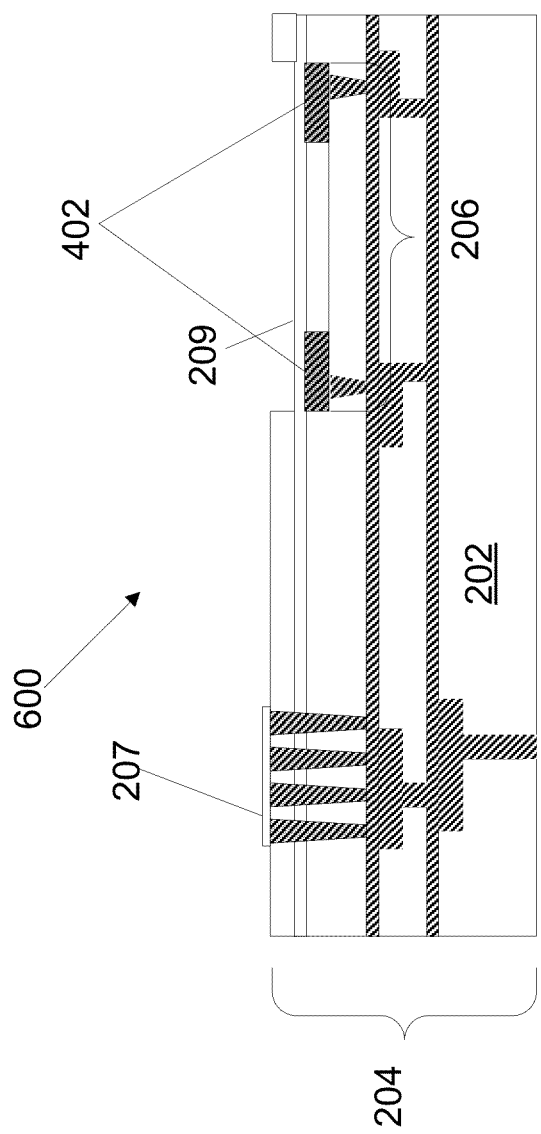
FIGS. 6A to 6F are diagrams illustrating providing fusing after packaging of semiconductor devices in accordance with an alternative embodiment of the present disclosure.

Referring to FIGS. 6A to 6F, diagrams illustrating providing fusing after packaging of semiconductor devices are depicted in accordance with an alternative embodiment of the present disclosure. FIG. 6A is similar to FIG. 2A in that wafer 600 also comprises substrate 202, a plurality of layers 204, a fuse area 206, a protective layer 209, and a contact pad 207.

Instead of one or more fuses 208, fuse area 206 comprises a plurality of contact pads 402 that are disposed over substrate or carrier 202. The plurality of contact pads 402 may be composed of aluminum or other types of metallic material.

Figure 6B:
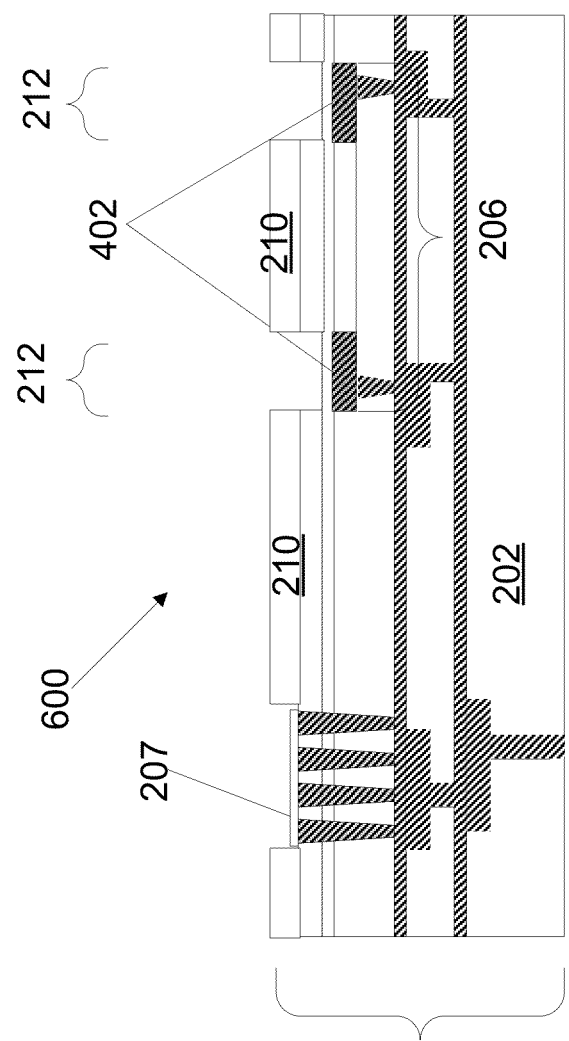

Referring to FIG. 6B, a dielectric layer 210 is then disposed and structured over the wafer 600. In this case, openings 212 are formed in the dielectric layer 210 to expose the plurality of contact pads 402 for photolithography processing.

Figure 6C:
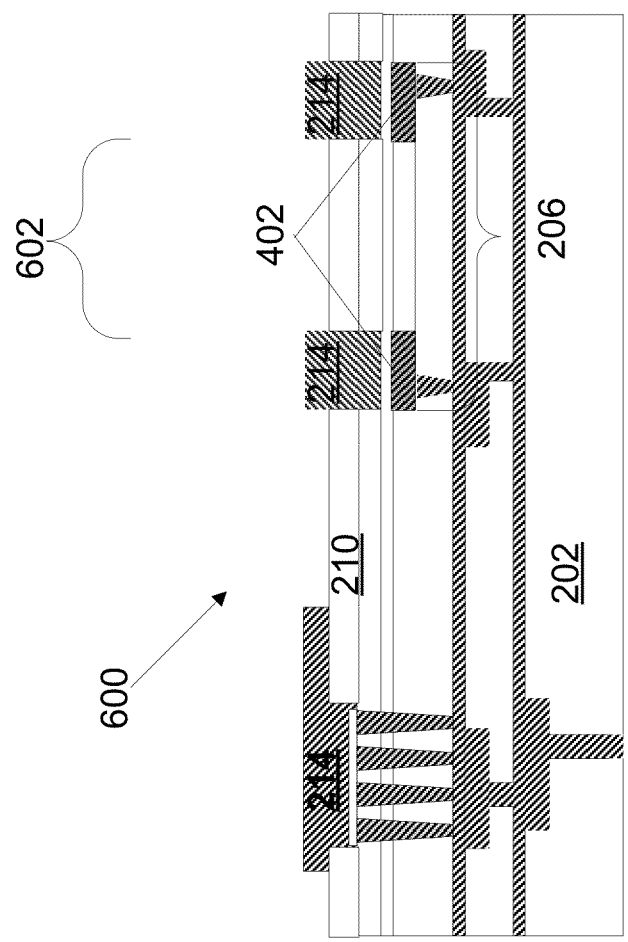

Referring to FIG. 6C, a redistribution layer 214 is then disposed over dielectric layer 210 and structured to provide external connections. The redistribution layer 214 may be composed of metallic material. Some of the redistribution lines in the redistribution layer 214 may route around the fuse area 206. In addition, redistribution or metallic material are disposed over contact pads 402 in the redistribution layer 214 and etched or cut to provide spaces 602 between the plurality of contact pads 402.

Figure 6D:
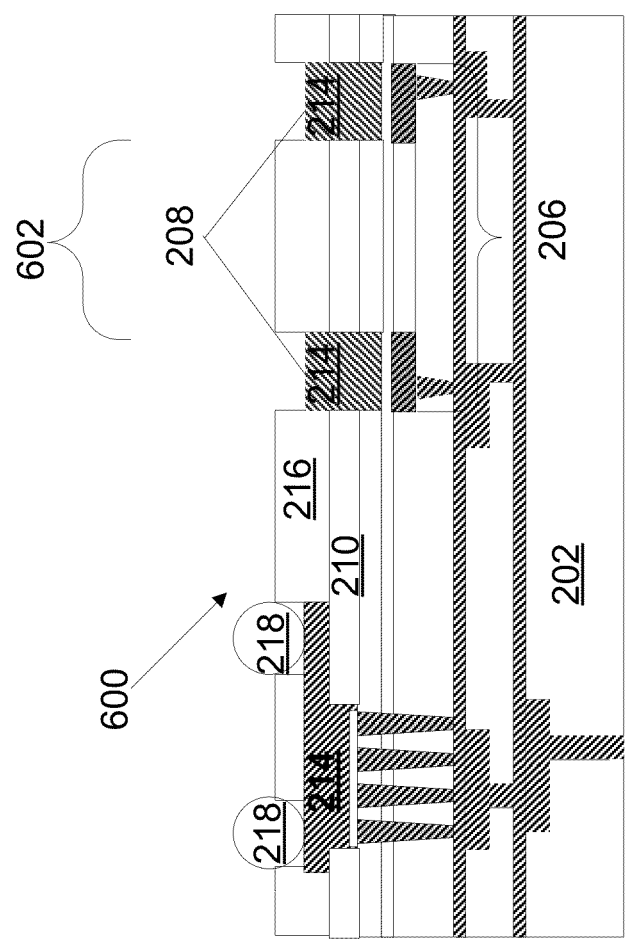

Referring to FIG. 6D, a solder stop layer 216 is then disposed over the redistribution layer 214 and structured to provide landing pads for external contact elements. The solder stop layer 216 is also disposed over the fuse area 206 between the spaces 602 of the plurality of contact pads 402 to form one or more fuses 208. Conductive elements 218 such as solder balls may be disposed in the landing pads provided by solder stop layer 216 to provide external electrical connections.

Figure 6E:
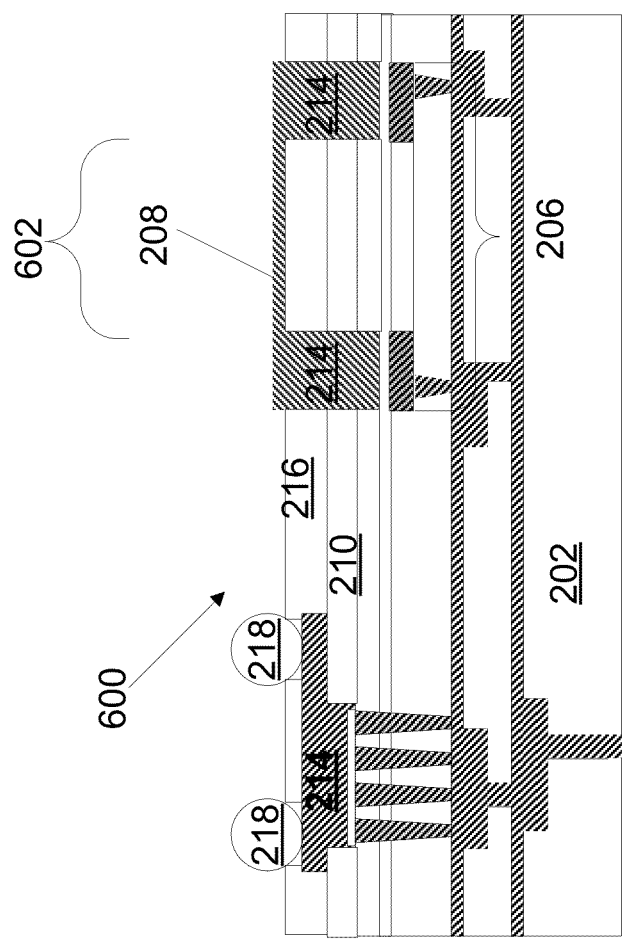

After the conductive elements 218 are applied, the packaging process is complete. Electrical performance testing may then be performed. Typically, electrical performance testing is performed through contacting the conductive elements 218. Referring to FIG. 6E, after electrical performance testing, fusing is performed to close one or more fuses 208 within fuse area 206. The one or more fuses 208 may be closed by electroplating, printing, or disposing conductive material between spaces 602 of the plurality of contact pads 402, which formed one or more fuses 208 in the redistribution layer 214. During attachment of the conductive elements 218, a reflow process is performed under high temperature. By fusing after such reflow process, performance improvement may be made with the consideration of the reflow process.

Figure 6F:
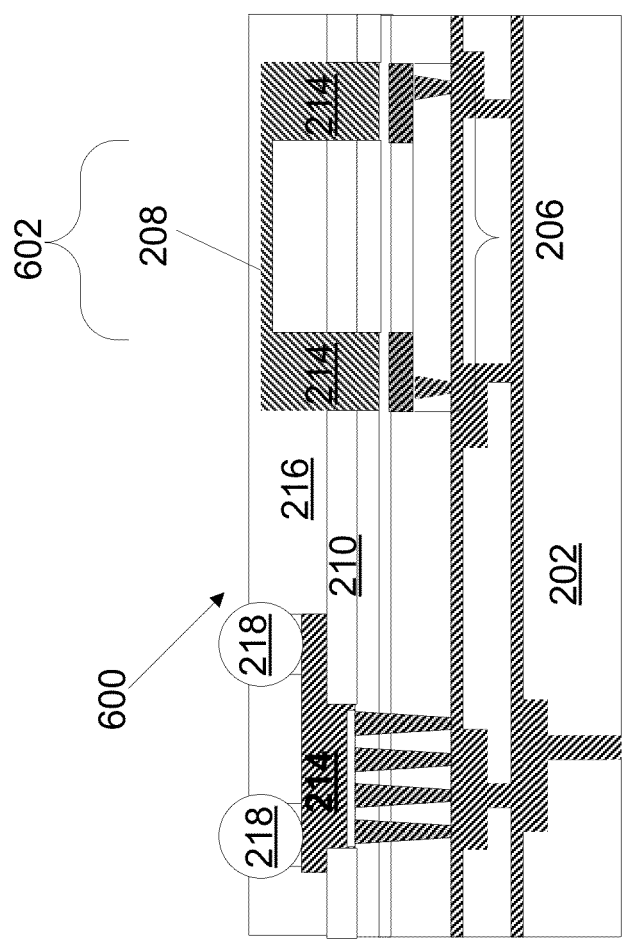

Referring to FIG. 6F, after fusing is complete, the one or more fuses 208 may be optionally covered by a solder stop material 216 or other material to protect the fuse area 206 from external influence. After the optional fuse area closing, conductive elements 218 such as solder balls may be disposed in the landing pads provided by solder stop layer 216 to provide external electrical connections.

Referring to FIGS. 7A to 7C, diagrams illustrating fuses formed in the redistribution layer are depicted in accordance with an alternative embodiment of the present disclosure. Referring to FIG. 7A, a plurality of contact pads 402 are provided in the fuse area 206. In one embodiment, the plurality of contact pads 402 may be composed of aluminum or other metallic material. As described previously in FIG. 6A, the plurality of contact pads 402 are disposed over substrate or carrier 202. In this example, eight contact pads are provided, contact pads 702 to 716.

Referring to FIG. 7B, one or more fuses are formed in the redistribution layer by the plurality of contact pads 702 in the fuse area 206. The plurality of contact pads 402 are disposed with redistribution or metallic material in the redistribution layer 214 and etched or cut to provide spaces 602 between the plurality of contact pads 402. For example, contact pads 702 and 710 form fuse 720, contact pads 704 and 712 form fuse 722, contact pads 706 and 714 form fuse 724, and contact pads 708 and 716 form fuse 726.

Referring to FIG. 7C, the one or more fuses are closed within fuse area 206 after electrical performance test is performed. In this example, fuse 722 and 726 are closed after electrical performance testing. In one embodiment, fuse 722 and 726 may be closed by electroplating, printing, or disposing conductive material in between the spaces 602 that were etched or cut between the plurality of contact pads 402.

As discussed above, fusing is provided after packaging of semiconductor device. With the ability to adjust fuse configuration after packaging and/or electrical performance or functionality testing, the frequency of frequency adjust fuses may be adjusted in a radar sensor, for example. In addition, the post-packaging fusing configuration adjustment may be used in some memory products to configure usable memory cells. For example, fusing may be used to select working area of the semiconductor chip and to switch on and off redundant area of the chip.

Also as described above, fusing may be used for single chip tracking after packaging. Single chip tracking provides the ability to identify a specific position of a semiconductor chip on a wafer. In this case, not only can single chip tracking be performed on a regular wafer, it may also be performed on a reconstituted wafer. In one embodiment, coding by fusing may be performed right after wafer processing and before the dielectric layer is applied. Alternatively, as described above in the various embodiment of the present disclosure, fusing may be performed after packaging to eliminate the need for de-mounting the chip.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A semiconductor device comprising:
a substrate comprising a fuse area;
at least one fuse disposed in the fuse area; and at least one layer disposed over the substrate;
at least one exposed conductive element disposed on the at least one layer;
wherein the at least one layer comprises at least one opening exposing the at least one fuse.

2. The semiconductor device of claim 1, wherein the at least one layer comprises:
a dielectric layer disposed over the substrate; a redistribution layer disposed over a portion of the dielectric layer and around the at least one opening; and a solder stop layer disposed over the redistribution layer and around the at least one opening.

3. The semiconductor device of claim 1, further comprises:
a thin protective layer disposed over the at least one fuse.

4. The semiconductor device of claim 1, wherein a portion of the at least one fuse is removed through the at least one opening.

5. The semiconductor device of claim 1, further comprising:
a solder stop layer disposed over the at least one fuse.

* * * * *